(12) United States Patent　　　(10) Patent No.:　US 12,644,936 B2

Fahmy　　　(45) Date of Patent:　Jun. 2, 2026

(54) CHOPPING SCHEME FOR MAGNETIC FIELD SENSOR HAVING SHARED ADC

(71) Applicant: Allegro MicroSystems, LLC, Manchester, NH (US)

(72) Inventor: Ahmed Hassan Fahmy, Andover, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 428 days.

(21) Appl. No.: 18/465,307

(22) Filed: Sep. 12, 2023

(65) Prior Publication Data

US 2025/0085363 A1　　Mar. 13, 2025

(51) Int. Cl.
G01R 33/07　　　(2006.01)

(52) U.S. Cl.
CPC .................................... G01R 33/07 (2013.01)

(58) Field of Classification Search
CPC ... G01R 33/07; G01R 33/0029; G01R 33/075
See application file for complete search history.

(56) References Cited

U.S. PATENT DOCUMENTS

| | | |
|---|---|---|
| 3,778,794 A | 12/1973 | Szabo et al. |
| 4,236,832 A | 12/1980 | Komatsu et al. |
| 4,438,347 A | 3/1984 | Gehring |
| 4,752,733 A | 6/1988 | Petr et al. |
| 4,758,943 A | 7/1988 | Aström et al. |
| 4,760,285 A | 7/1988 | Nelson |
| 4,767,989 A | 8/1988 | Meyer et al. |
| 4,823,075 A | 4/1989 | Alley |
| 4,833,406 A | 5/1989 | Foster |
| 4,970,411 A | 11/1990 | Halg et al. |
| 5,247,278 A | 9/1993 | Pant et al. |
| 5,329,416 A | 7/1994 | Ushiyama et al. |
| 5,343,143 A | 8/1994 | Voisine et al. |
| 5,412,255 A | 5/1995 | Wallrafen |
| 5,424,558 A | 6/1995 | Borden et al. |
| 5,469,058 A | 11/1995 | Dunnam |
| 5,517,112 A | 5/1996 | Vig et al. |

(Continued)

FOREIGN PATENT DOCUMENTS

| | | |
|---|---|---|
| JP | 2008286695 A | 11/2008 |
| WO | WO 02/03087 A1 | 1/2002 |

OTHER PUBLICATIONS

Hassan et al., A DC to 25 MHz Current Sensing Interface for Hall-Effect Sensor, Apr. 1, 2024, IEEE Sensors Journal, vol. 24 No 7, pp. 10316-10325 (Year: 2024).*

(Continued)

*Primary Examiner* — Mi'Schita' Henson

(74) *Attorney, Agent, or Firm* — DALY, CROWLEY, MOFFORD & DURKEE, LLP

(57)　　　　ABSTRACT

Methods and apparatus for magnetic field sensor having a sample chopping with a shared ADC. A sensor may include receiving a chopping sequence for samples from first and second channels that share an analog-to-digital converter (ADC) in a magnetic field sensor. The samples for the first and second channel are timed with respect to a virtual sampling time (VST), such that a sum of the sample times for the samples for the first channel is equal to the VST, and a sum of the sample times for the samples for the second channel is equal to VST.

23 Claims, 13 Drawing Sheets

(56) References Cited

U.S. PATENT DOCUMENTS

| | | | |
|---|---|---|---|
| 5,521,501 A | 5/1996 | Dettmann et al. |
| 5,619,137 A | 4/1997 | Vig et al. |
| 5,621,319 A | 4/1997 | Bilotti et al. |
| 5,640,090 A | 6/1997 | Furuya et al. |
| 5,781,005 A | 7/1998 | Vig et al. |
| 5,844,140 A | 12/1998 | Seale |
| 5,917,320 A | 6/1999 | Scheller et al. |
| 5,936,498 A | 8/1999 | Takeshima et al. |
| 6,011,770 A | 1/2000 | Tan |
| 6,091,239 A | 7/2000 | Vig et al. |
| 6,211,673 B1 | 4/2001 | Gerber et al. |
| 6,278,269 B1 | 8/2001 | Vig et al. |
| 6,351,506 B1 | 2/2002 | Lewicki |
| 6,392,478 B1 | 5/2002 | Mulder et al. |
| 6,433,545 B1 | 8/2002 | Kunze et al. |
| 6,436,748 B1 | 8/2002 | Forbes et al. |
| 6,437,558 B2 | 8/2002 | Li et al. |
| 6,525,531 B2 | 2/2003 | Forrest et al. |
| 6,693,419 B2 | 2/2004 | Stauth et al. |
| 6,750,644 B1 | 6/2004 | Berkcan |
| 6,853,178 B2 | 2/2005 | Hayat-Dawoodi |
| 6,896,407 B2 | 5/2005 | Nomiyama et al. |
| 6,917,321 B1 | 7/2005 | Haurie et al. |
| 7,026,808 B2 | 4/2006 | Vig et al. |
| 7,038,448 B2 | 5/2006 | Schott et al. |
| 7,190,784 B2 | 3/2007 | Li |
| 7,253,614 B2 | 8/2007 | Forrest et al. |
| 7,259,545 B2 | 8/2007 | Stauth et al. |
| 7,292,095 B2 | 11/2007 | Burt et al. |
| 7,319,319 B2 | 1/2008 | Jones et al. |
| 7,323,870 B2 | 1/2008 | Tatschl et al. |
| 7,325,175 B2 | 1/2008 | Momtaz |
| 7,345,470 B2 | 3/2008 | Suzuki |
| 7,368,904 B2 | 5/2008 | Scheller et al. |
| 7,425,821 B2 | 9/2008 | Monreal et al. |
| 7,474,093 B2 | 1/2009 | Ausserlechner |
| 7,518,354 B2 | 4/2009 | Stauth et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,764,118 B2 | 7/2010 | Kusuda et al. |
| 7,769,110 B2 | 8/2010 | Momtaz |
| 7,772,838 B2 | 8/2010 | Bailey et al. |
| 7,777,607 B2 | 8/2010 | Taylor et al. |
| 7,800,389 B2 | 9/2010 | Friedrich et al. |
| 7,859,255 B2 | 12/2010 | Doogue et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,128,549 B2 | 3/2012 | Testani et al. |
| 8,134,358 B2 | 3/2012 | Charlier et al. |
| 8,203,329 B2 | 6/2012 | Hohe et al. |
| 8,447,556 B2 | 5/2013 | Friedrich et al. |
| 8,450,996 B2 | 5/2013 | Foletto et al. |
| 8,542,010 B2 | 9/2013 | Cesaretti et al. |
| 8,564,285 B2 | 10/2013 | Romero et al. |
| 8,576,589 B2 | 11/2013 | Melanson et al. |
| 8,624,588 B2 | 1/2014 | Vig et al. |
| 8,680,846 B2 | 3/2014 | Cesaretti et al. |
| 8,680,848 B2 | 3/2014 | Foletto et al. |
| 8,692,546 B2 | 4/2014 | Cesaretti et al. |
| 8,729,892 B2 | 5/2014 | Friedrich |
| 8,818,749 B2 | 8/2014 | Friedrich et al. |
| 9,645,220 B2 | 5/2017 | Cesaretti et al. |
| 9,735,773 B2 | 8/2017 | McIntosh et al. |
| 9,804,222 B2 | 10/2017 | Petrie et al. |
| 9,817,083 B2 | 11/2017 | Romero |
| 10,270,428 B1 | 4/2019 | Geisler et al. |
| 10,444,299 B2 | 10/2019 | Romero et al. |
| 10,451,671 B2 | 10/2019 | Petrie et al. |
| 10,481,219 B2 | 11/2019 | Romero et al. |
| 10,866,289 B2 | 12/2020 | Cook |
| 11,163,019 B1 | 11/2021 | Chaware et al. |
| 11,169,223 B2 | 11/2021 | Ostermann et al. |
| 11,333,718 B2 | 5/2022 | Ronis et al. |
| 11,768,259 B1 | 9/2023 | Rubinsztain et al. |
| 2001/0046348 A1 | 11/2001 | Sarkimukka et al. |
| 2002/0084923 A1 | 7/2002 | Li |
| 2003/0038675 A1 | 2/2003 | Gailus et al. |
| 2003/0102909 A1 | 6/2003 | Motz |
| 2003/0225539 A1 | 12/2003 | Motz et al. |
| 2006/0202692 A1 | 9/2006 | Tatschl et al. |
| 2007/0110199 A1 | 5/2007 | Momtaz et al. |
| 2007/0247141 A1 | 10/2007 | Pastre et al. |
| 2007/0285089 A1 | 12/2007 | Ibuki et al. |
| 2008/0048772 A1 | 2/2008 | Nishikawa |
| 2008/0094055 A1 | 4/2008 | Monreal et al. |
| 2008/0110987 A1 | 5/2008 | Cato et al. |
| 2008/0137784 A1 | 6/2008 | Krone |
| 2008/0238410 A1 | 10/2008 | Charlier et al. |
| 2008/0265880 A1 | 10/2008 | Nishikawa |
| 2008/0278158 A1 | 11/2008 | Granig et al. |
| 2009/0001964 A1 | 1/2009 | Strzalkowski et al. |
| 2009/0001972 A1 | 1/2009 | Fernandez et al. |
| 2009/0033324 A1 | 2/2009 | Tomida et al. |
| 2009/0085706 A1 | 4/2009 | Baarman et al. |
| 2009/0212765 A1 | 8/2009 | Doogue et al. |
| 2009/0237075 A1 | 9/2009 | Koss |
| 2009/0295350 A1 | 12/2009 | Yamada |
| 2010/0117638 A1 | 5/2010 | Yamashita et al. |
| 2010/0141275 A1 | 6/2010 | Matsushima |
| 2010/0211347 A1 | 8/2010 | Friedrich et al. |
| 2010/0301791 A1 | 12/2010 | Watanabe et al. |
| 2011/0018533 A1 | 1/2011 | Cesaretti et al. |
| 2011/0031965 A1 | 2/2011 | Saruki et al. |
| 2011/0048102 A1 | 3/2011 | Fernandez et al. |
| 2011/0133723 A1 | 6/2011 | Forsyth et al. |
| 2011/0298448 A1 | 12/2011 | Foletto et al. |
| 2012/0016614 A1 | 1/2012 | Hohe et al. |
| 2012/0112695 A1 | 5/2012 | Nishi et al. |
| 2012/0249126 A1 | 10/2012 | Friedrich et al. |
| 2012/0274314 A1 | 11/2012 | Cesaretti et al. |
| 2012/0299588 A1 | 11/2012 | Petrie |
| 2012/0313635 A1 | 12/2012 | Daubert |
| 2013/0015853 A1 | 1/2013 | Raz et al. |
| 2013/0093412 A1 | 4/2013 | Anelli et al. |
| 2013/0134872 A1 | 5/2013 | Lidstrom |
| 2013/0214774 A1 | 8/2013 | Cesaretti et al. |
| 2013/0335069 A1 | 12/2013 | Vig et al. |
| 2014/0009144 A1 | 1/2014 | Romero |
| 2014/0177674 A1 | 6/2014 | Drouin et al. |
| 2014/0210462 A1 | 7/2014 | Yamamoto |
| 2014/0266176 A1 | 9/2014 | Fernandez et al. |
| 2014/0312883 A1 | 10/2014 | Friedrich et al. |
| 2015/0070002 A1 | 3/2015 | Schott |
| 2015/0301149 A1 | 10/2015 | Cesaretti et al. |
| 2016/0047864 A1 | 2/2016 | Nishimura |
| 2016/0139199 A1 | 5/2016 | Petrie et al. |
| 2016/0139229 A1 | 5/2016 | Petrie et al. |
| 2018/0372809 A1 | 12/2018 | Angelini et al. |
| 2019/0079146 A1 | 3/2019 | Romero et al. |
| 2019/0302196 A1* | 10/2019 | Cook ..................... H10N 52/80 |

OTHER PUBLICATIONS

U.S. Appl. No. 18/056,821, filed Nov. 18, 2022, Javvaji et al.
U.S. Appl. No. 18/164,676, filed Feb. 6, 2023, Daigle et al.
Extended European Search Report dated Sep. 3, 2019 for European Application No. 19161225.8; 6 Pages.
Communication pursuant to Rule 69 EPC dated Oct. 8, 2019 for European Application No. 19161225.8; 2 pages.
Response (with Amended Claims) to European Official Communication dated Oct. 8, 2019 and to European Extended Search Report (EESR) dated Sep. 3, 2019 for European Application No. 19161225.8; Response filed Apr. 2, 2020; 50 Pages.
U.S. Preliminary Amendment filed on Jan. 8, 2020 for U.S. Appl. No. 15/936,888; 51 Pages.

(56)    References Cited

OTHER PUBLICATIONS

U.S. Restriction Requirement dated Mar. 6, 2020 for U.S. Appl. No. 15/936,888; 7 Pages.
Response to U.S. Restriction Requirement dated Mar. 6, 2020 for U.S. Appl. No. 15/936,888; Response filed Mar. 25, 2020; 1 Page.
U.S. Non-Final Office Action dated Jul. 23, 2020 for U.S. Appl. No. 15/936,888; 14 Pages.
Response to U.S. Non-Final Office Action dated Jul. 23, 2020 for U.S. Appl. No. 15/936,888; Response filed Aug. 12, 2020; 13 Pages.
U.S. Notice of Allowance dated Sep. 30, 2020 for U.S. Appl. No. 15/936,888; 9 Pages.
U.S. Amendment Under Rule 312 filed on Oct. 19, 2020 for U.S. Appl. No. 15/936,888; 12 Pages.
European Examination Report dated Nov. 26, 2021 for European Application No. 19161225.8; 10 Pages.
Response to European Examination Report dated Nov. 26, 2021 for European Application No. 19161225.8; Response filed Jun. 6, 2022; 47 Pages.

* cited by examiner

*--Prior Art--*

$$y^*[n]=b_1 y[n-1]+b_2 y[n]$$

CHOPPING SCHEME FOR MAGNETIC FIELD SENSOR HAVING SHARED ADC

BACKGROUND

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Particular magnetic field sensor arrangements are used as examples herein. However, the circuits and techniques described herein apply also to any magnetic field sensor.

It is known that magnetic field sensing elements, such as Hall Effect elements, may exhibit an undesirable DC offset voltage. Techniques have been developed to reduce the DC offset voltage, while still allowing the Hall Effect element to sense a DC magnetic field. One such technique is commonly referred to as "chopping." Chopping is a technique by which a Hall Effect element is driven in two or more different directions with outputs are received at different output terminals as the Hall Effect element is differently driven. With chopping, offset voltages of the different driving arrangements tend to cancel toward zero. U.S. Published Patent Application No. 2014/0009144, which is incorporated herein by reference, discloses an example chopping scheme.

SUMMARY

Example embodiments of the disclosure provide methods and apparatus for magnetic field sensors having sensing element chopping schemes or sequences of samples that can be used with time-shared ADCs to efficiently suppress error due to differences in sample times. In embodiments, chopping schemes arrange samples in time for the different channels of the sensing elements in a way that ensures that the channel samples have the same center of mass, which results in the demodulated samples being equivalently interpolated in a way as if they were all sampled at the same time. In embodiments, no extra logic or storage is needed to perform interpolation of samples across multiple frames. In some embodiments, chopping schemes are effective in suppressing low-frequency flicker noise in analog front-end circuitry.

In one aspect, a method comprises: receiving a chopping sequence for samples from first and second channels that share an analog-to-digital converter (ADC) in a magnetic field sensor, wherein the samples for the first and second channel are arranged in time with respect to a virtual sampling time (VST) at each frame of samples, wherein an average of sample times of samples of a given one of the first and second channels in one frame aligns with the virtual sample time (VST) of the respective time frame.

A method can further include one or more of the following features: the chopping sequence comprises 2× chopping, the chopping sequence comprises 4× chopping, the samples for the first and second channels are processed in one frame of data, the samples for the first and second channels are demodulated and interpolated in one processing step, the first channel comprises a sine channel and the second channel comprises a cosine channel, combining samples for the first channel using a summer and a delay for demodulation and interpolation, the chopping sequence includes samples for at least four channels, determining the chopping sequence to reduce flicker noise, the chopping sequence includes samples for a first frame and samples for a second frame to reduce flicker noise, a first magnetic field sensing element is configured to generate the samples for the first channel and a second magnetic field sensing element is configured to generate the samples for the second channel, and/or the first magnetic field sensing element comprises a Hall element.

In another aspect, a magnetic field sensor comprises: an analog-to-digital converter (ADC) configured to receive a chopping sequence for samples from first and second channels that share the ADC; wherein the samples for the first and second channel are arranged in time with respect to a virtual sampling time (VST) at each frame of samples, wherein an average of sample times of samples of a given one of the first and second channels in one frame aligns with the virtual sample time (VST) of the respective time frame.

A sensor can further include one or more of the following features: the chopping sequence comprises 2× chopping, the chopping sequence comprises 4× chopping, the samples for the first and second channels are processed in one frame of data, the samples for the first and second channels are demodulated and interpolated in one processing step, the first channel comprises a sine channel and the second channel comprises a cosine channel, the sensor is configured to combine samples for the first channel using a summer for demodulation and a delay function for interpolation, the chopping sequence includes samples for at least four channels, the chopping sequence includes samples for a first frame and samples for a second frame to reduce flicker noise, a first magnetic field sensing element is configured to generate the samples for the first channel and a second magnetic field sensing element is configured to generate the samples for the second channel, and/or the first magnetic field sensing element comprises a Hall element.

BRIEF DESCRIPTION OF THE DRAWINGS

The foregoing features of the disclosure may be more fully understood from the following detailed description of the drawings, in which:

FIG. 6A represents the processing for channels A and B, while FIG. 6B represents the processing for channels C and D.

DETAILED DESCRIPTION

Figure 1:
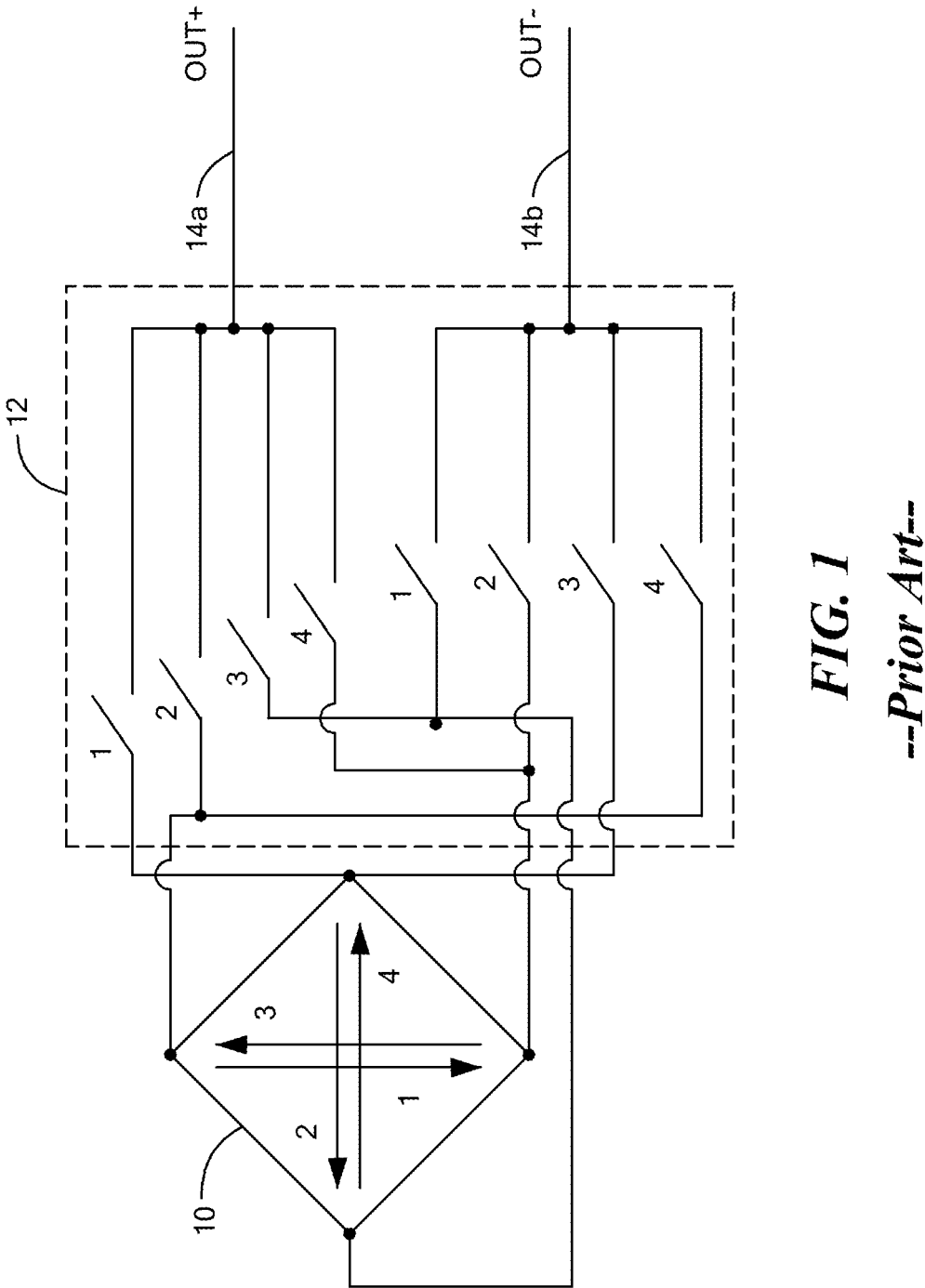
FIG. 1 is a block diagram showing a Hall Effect element and a switching circuit coupled in a prior art four-phase (4×) chopping arrangement.

FIG. 1 shows an example chopping operation for a magnetic field sensing element 10, shown as a Hall effect element, with 4× chopping or spinning for suppressing offset errors. In the illustrated embodiment, the Hall effect element 10 is chopped by operation of an N-Phase modulator circuit 12, here shown to be a four-phase modulator circuit 12. The four-phase modulator circuit 12 can include a plurality of switches coupled to the Hall Effect element 10 in four different arrangements. The plurality of switches can provide a differential output signal 14a, 14b.

In operation, and in accordance with four-phase (i.e., 4×) chopping, the Hall Effect element 10 can be driven with currents in four different directions represented by four arrows numbered 1-4. At the same time, respective pairs of the switches are closed. For example, when the current through the Hall Effect element 10 is in a direction represented by the arrow labeled 1, two switches also labeled 1 are closed and the other switches are open. There are four such arrangements of drive currents and pairs of switch closures indicated. For such arrangements occur in sequence, and thus, they are often referred to as chopping phases. The chopping phases are sequenced at a rate related to a chopping frequency, described more fully below. It will be understood that each chopping phase in sequence contributes to the differential output signal 14a, 14b.

Figure 2:
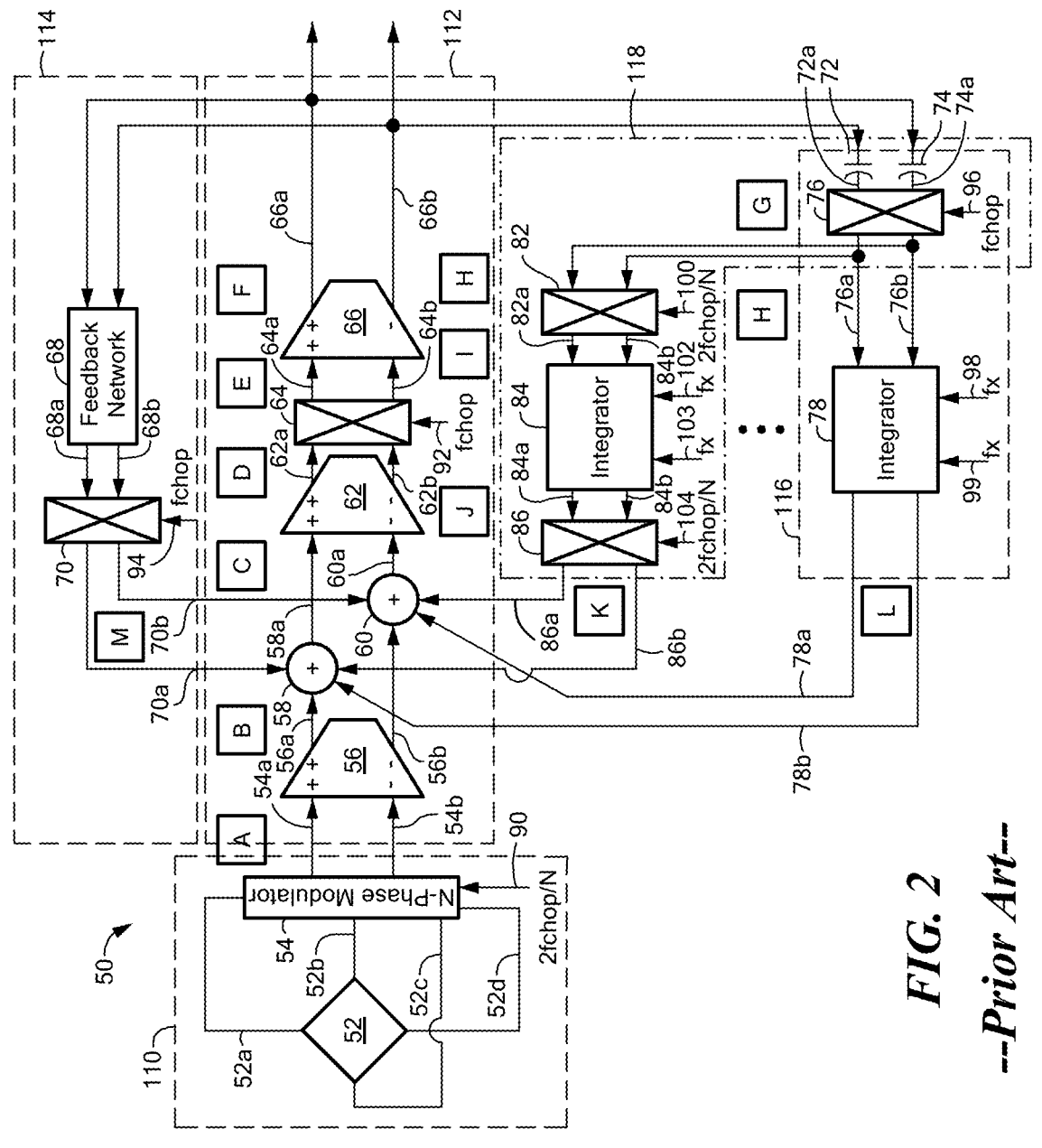
FIG. 2 is a schematic representation of an example sensor having prior art chopping.

FIG. 2 shows an example magnetic field sensor 50 having a Hall Effect element 52 coupled to an N-phase modulator circuit 54 in a chopped circuit 96. The Hall Effect element 52 and the N-phase modulator circuit can be the same as or similar to the Hall Effect element 10 and the N-phase modulator 12 of FIG. 1. It should be understood that many different chopping arrangements can be used, including, but not limited to, a 2×, a 4×, and an 8× chopping arrangement, where N=2, 4, or 8.

The N-phase modulator circuit 54 can be configured to generate a differential output signal 54a, 54b, which can be the same as or similar to the differential output signal 14a, 14b of FIG. 1. For reference in figures below, the differential signal 54a, 54b is labeled as a signal A, and other differential signal described below are labeled with other letters.

A primary circuit path 112, and, in particular an amplifier 56, can be coupled to receive the differential signal 54a, 54b and configured to generate an amplified differential output signal 56a, 56b, which is labeled as a signal B. In some embodiments, the amplifier 56 is a transconductance amplifier. A summing node 58 can be coupled to receive the signal 56a and another summing node 60 can be coupled to receive the signal 56b. The summing nodes 58, 60 can also be coupled to receive other signals described more fully below. The summing nodes 58, 60 are configured to provide a differential signal 58a, 60a, which is labeled as a signal C.

Another amplifier 62 is coupled to receive the differential signal 58a, 60a and configured to generate an amplified signal 62a, 62b, which is labeled as a signal D. In some embodiments, the amplifier 62 is also a transconductance amplifier. A switching circuit 64 can be coupled to receive the differential signal 62a, 62b and configured to generate a differential switched signal 64a, 64b, which is labeled as a signal E. Another amplifier 66 is coupled to receive the differential switched output signal 64a, 64b and configured to generate another differential amplified signal 66a, 66b, which is labeled as a signal F. In some embodiments the amplifier 66 is a transconductance amplifier. While transconductance amplifiers are described above, in other embodiments, the various amplifiers can be voltage amplifiers.

The differential amplified signal 66a, 66b can correspond to a differential output signal from the magnetic field sensor 50. It is desirable that the differential output signal 66a, 66b include only of signal components directly related to that magnetic field which the Hall Effect element 52 senses, and not include undesirable signal components, for example, a DC offset component or other signal components.

The primary circuit path 112 can be used in conjunction with a gain feedback path 114. In general, the gain feedback path 114 is used to control and stabilize a gain of the primary circuit path 112. The gain feedback path 114 can include a feedback network 68 coupled to receive the differential output signal 66a, 66b and configured to generate a differential signal 68a, 68b. The feedback network 68 can be comprised, for example, of passive circuit elements, for example, resistors.

The gain feedback path 114 can also include a switching circuit 70 coupled to receive the differential signal 68a, 68b and configured to generate a differential switched signal 70a, 70b, which is labeled as a signal M. The summing circuit 58 can be coupled to receive the signal 70a, and the summing circuit 60 can be coupled to receive the signal 70b, providing a feedback arrangement.

The magnetic field sensor 50 can also include one or more feedback circuits. Here shown are a first feedback circuit 116 and an Mth feedback circuit 118. Taken together, the feedback circuits 116, 118 form a so-called "feedback circuit path," which is coupled at both ends to the primary circuit path 112, so as to form a feedback loop.

There are N/2 such feedback circuits within the feedback circuit path, where N equals the number of phases in the chopping of the Hall Effect element 52. Thus, M=N/2. For N=4, i.e., for four phase (4×) chopping, there are two such feedback circuits within the feedback circuit path. However, for 2× chopping, there is only one feedback circuit, i.e., the feedback circuit 116, within the feedback circuit path. As described above, there can be any number of phases in the chopping of the Hall Effect element 52, and any resulting number of feedback circuits within the feedback circuit path.

The first feedback circuit 116 can include first and second capacitors 72, 74, respectively, coupled to receive the differential output signal 66a, 66b. At opposite ends of the two capacitors 72, 74, a differential signal 72a, 74a is generated, which is labeled as a signal G, and which has no DC signal component, since the DC component is blocked by the two capacitors 72, 74.

The first feedback circuit 116 can also include a switching circuit 76 coupled to receive the differential signal 72a, 74 and configured to generate a differential switched signal 76a, 76b, which is labeled as a signal H. An integrator 78 is coupled to receive the differential switched signal 76a, 76b and configured to generate a differential integrated signal 78a, 78b, which is labeled as a signal L. The summing circuit 58 can be coupled to receive the signal 78b and the summing circuit 60 can be coupled to receive the signal 78a, or vice versa.

The Mth feedback circuit 118 can include a switching circuit 82 coupled to receive the differential signal 76a, 76b and configured to generate a differential switched signal 82a, 82b, which is labeled as a signal I. An integrator 84 can be coupled to receive the differential switched signal 82a, 82b and configured to generate a differential integrated signal 84a, 84b, which is labeled as a signal J. A switching circuit 86 can be coupled to receive the differential integrated signal 84a, 84b and configured to generate a differential switched signal 86a, 86b, which is labeled as a signal K. The summing circuit 58 can be coupled to receive the signal 86b and the summing circuit 60 can be coupled to receive the signal 78a, or vice versa.

It should be recognized that the differential signal 78a, 78b and the differential switched signal 86a, 86b are added to signals within the primary circuit path 112. It will become apparent from discussion below that the differential signal 78a, 78b can cancel some undesirable signal components within the primary circuit path 112 and, in some embodiments, the differential switched signal 86a, 86b can cancel some other undesirable signal components within the primary circuit path 112.

In some embodiments, the integrators 78, 84 are continuous, i.e., un-sampled, integrators, which can be either active or passive. Both active and passive integrator structures are known. In other embodiments, the integrators 78, 84 can be switched capacitor integrators. Switched capacitor integrators require clock signals. Thus, clock signals 98, 99, 102, 103 are shown to be received by the integrators 78, 84, respectively. The clock signals 98, 99, 102, 103 can be at any frequency, fx. However, as is known, any sampled system generates nulls in their transfer function at a clock frequency and at higher harmonics thereof. Therefore, it may be desirable to select a frequency of the clock signals 98, 99, 102, 103 such that nulls occur at particular frequencies, for example, at frequencies of fchop or fchop/2.

The switching circuits 82, 86 can be controlled by clock signals 100, 104, respectively, with frequencies of 2fchop/N. The switching circuit 76 can be controlled by a clock signal 96 with a frequency of fchop.

Figures 7A, 7B:
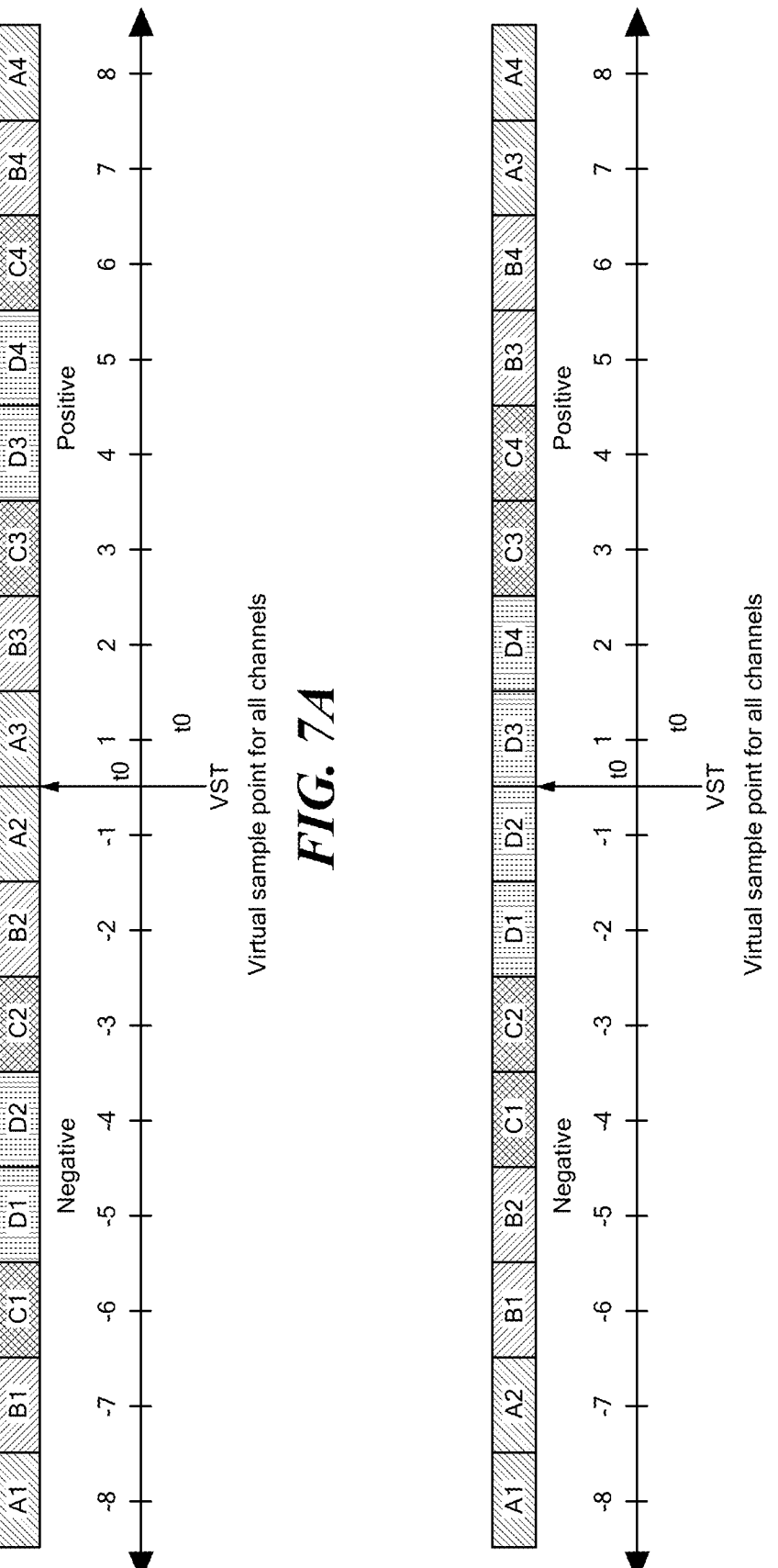
FIGS. 7A and 7B are schematic representations of example chopping schemes to reduce error in 4× chopping.

In some embodiments, an ADC may be shared among different channels to reduce cost. In example embodiments of the disclosure, chopping schemes are provided for shared ADC configurations to suppress error due to ffset. The sharing of the ADC introduces another sort of error due to the difference in sampling times of the different channels. As shown and described more fully below, example chopping schemes have time sampling of the different channels to ensure that the channel samples have the same center of mass which results in the demodulated samples to be equivalently interpolated as if they were all sampled at the same time. In embodiments having samples for first and second channels (or more) in a sequence, the samples for the first and second channel are timed with respect to a virtual sampling time (VST) at time zero (t0), where time before the time zero is negative and time after the time zero is positive, such that a sum of the sample times for the samples for the first channel is zero, and a sum of the sample times for the samples for the second channel is zero. An example of this sample sequence for providing self-interpolation to reduce error is shown in FIGS. 7A and 7B.

It is understood that time-sharing of an ADC has an impact on sensor accuracy when operations performed in a digital signal processor (DSP) involve more than one channel, for example CORDIC or angle calculation from X and Y channels. The error in time sharing is due to relative time shifts in samples. Analysis of this error can show that this error increases linearly with the frequency of the input signal assuming input signals are sine and cosine signals.

It is understood that example embodiments of the disclosure are applicable to sensors in general in which it is desirable to process multiple signals simultaneously. For example, in position/angle sensors, a first transducer generates X information and a second transducer generates Y information so that X and Y information can produce ARCTAN(Y/X) to provide the angle information for a target. The X and Y channels may share an ADC that processes both channels. As described more fully below, it is desirable to have the samples from the transducers appear as if they were sampled at exactly the same time so that large errors in the angle information are avoided. In other applications, such as torque (differential angle) sensors, there may be 4 channels, X1, Y1, X2 and Y2. From X1 and Y1 one obtains Angle1 and from X2 and Y2 one obtains Angle2. The angle information can be combined as Angle1-Angle2 to obtain torque information.

Figure 3:
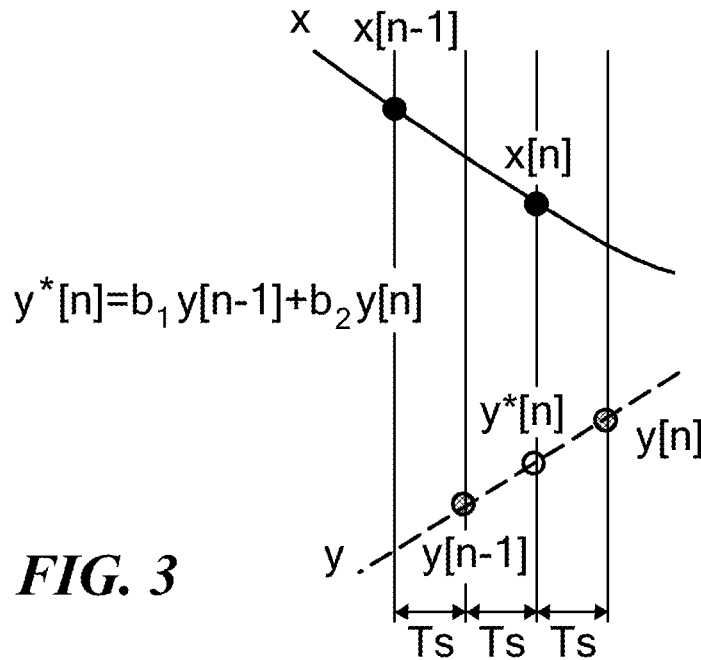
FIG. 3 is a graphical representation of interpolation.

FIG. 3 shows one example way to suppress sampling error by performing interpolation between two successive samples. In this example, two successive channel samples of y are used to obtain a virtual sample aligned with the sample time of x, which can be expressed as $$y^*[n] = b_1 y[n-1] + b_2 y[n]$$

Interpolation coefficients b1 and b2 depends on the timing between the captured samples (y[n], y[n−1]) and the target time of the virtual sample y*[n] aligned to x[n]. In this example both b1 and b2=0.5.

Figure 4:
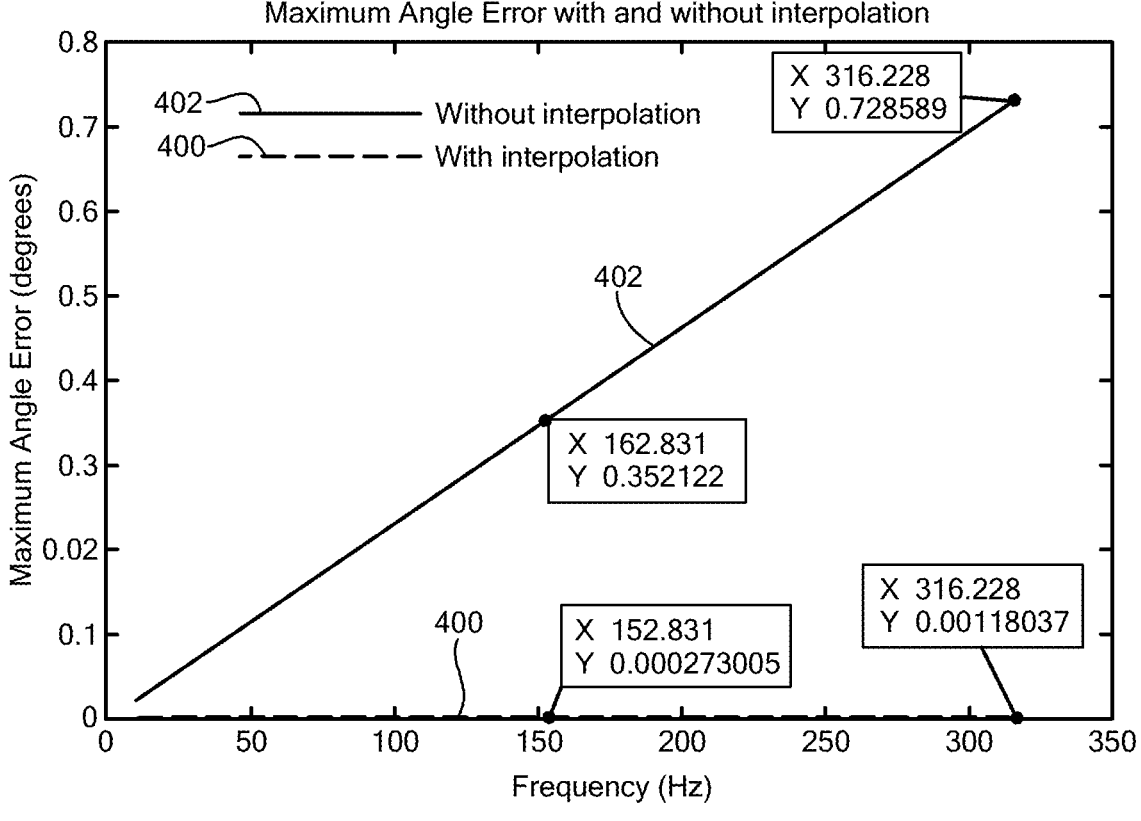
FIG. 4 is a graphical representation of angle error for a sensor with and without interpolation.

Referring now to FIG. 4, assume there are five channels sampled in round robin fashion by a shared ADC and assume two channels are a sine and cosine signal from which a target angle is calculated. The error because of time sharing with interpolation 400 and without interpolation 402 is shown. As can be seen, angle error increases as frequency increases without interpolation. In example embodiments, an angle sensor can include first and second magnetic field sensing elements, such as Hall elements, positioned in quadrature to generate signals in sine and cosine channels from which a target angle can be determined.

Figure 5:
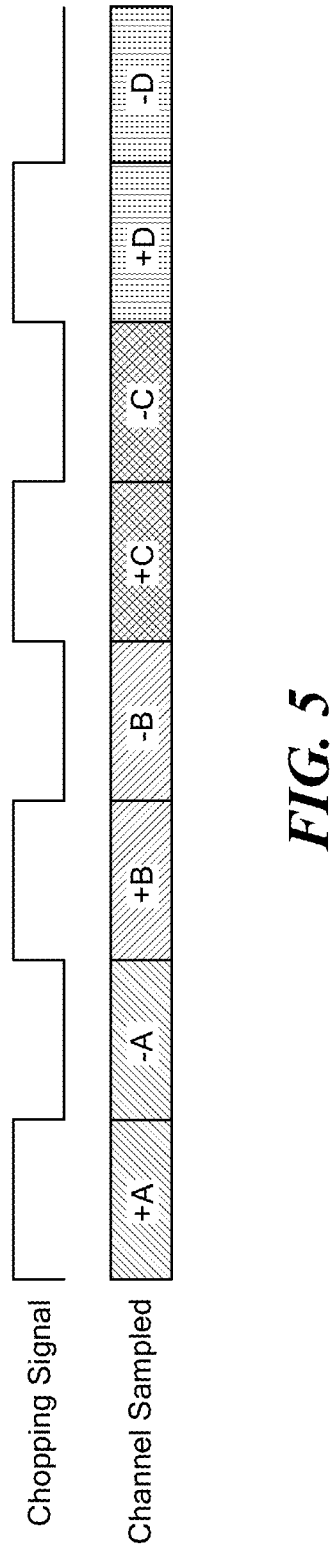
FIG. 5 is a representation of a prior art chopping scheme.

FIG. 5 shows a prior art 2x chopping scheme for four channels A, B, C, D with each channel having positive and negative phases +A, −A, +B, −B, +C, −C. +D, −D. As noted above, chopping is useful in suppressing Hall plate offset, amplifier offsets, and flicker noise. For the illustrated direct sequence of samples, the samples are first demodulated by subtracting each pair of samples after which the demodulated samples of each frame can be combined with the next frame or a previous frame to perform interpolation on samples and align effective sampling time.

In the illustrated embodiment, A+ and A− are used for 2× chopping in which the channel signal is sampled twice with different polarities to remove the offset. The first sample is $$Vin1 = A + \text{offset}$$

and the second sample is $$Vin2 = -A + \text{offset}$$

The a subtraction is performed as Vin_chopped=Vin1−Vin2 which results in 2*A. The offset is then canceled to a first order.

Figure 6A:
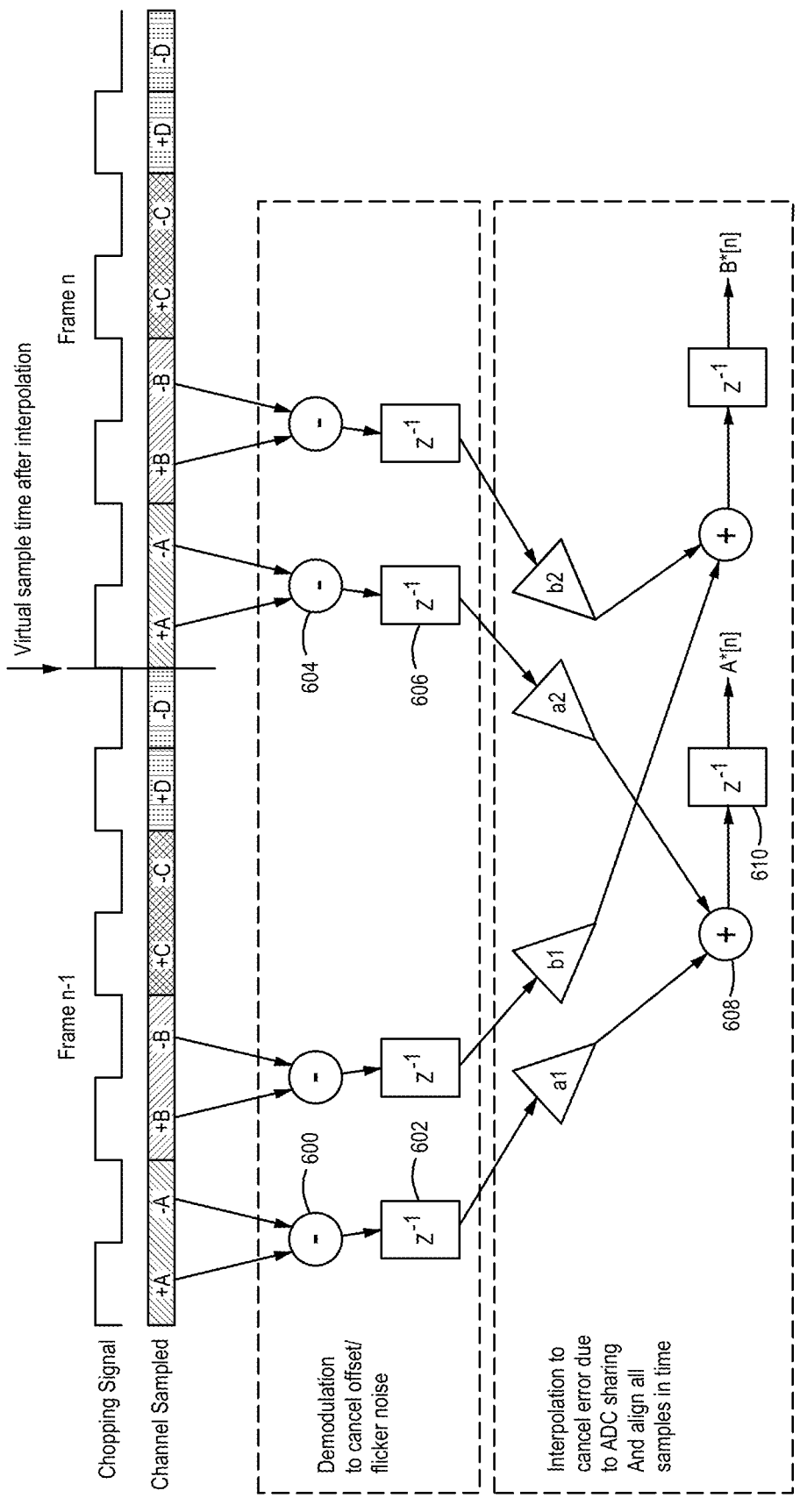
FIGS. 6A and 6B are schematic representations of prior art chopping schemes and sample processing for two of four channels with 2× chopping.
Figure 6B:
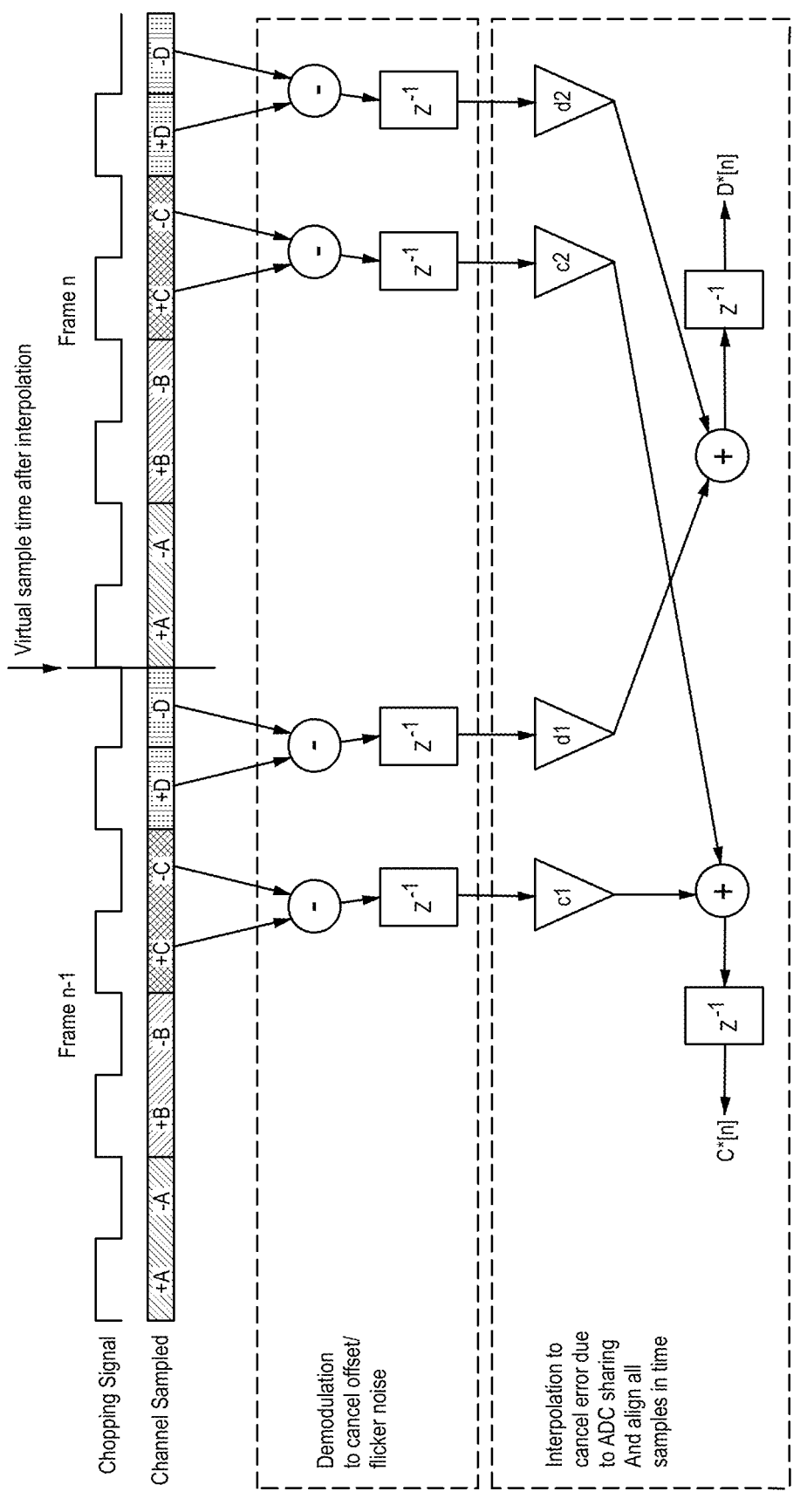

FIG. 6A shows an example prior art configuration to combine frame data to perform interpolation on samples and align effective sampling times. Channel sample +A, −A, +B, −B, and so on are shown for frame n−1 and frame n in relation to a chopping signal. It is understood that $Z^{-1}$ denotes a unit delay. As shown, samples +A, −A are subtracted 600 and delayed 602 to provide a first sample A[n−1] for frame n−1. Samples +A, −A from frame n are similarly subtracted 604 and delayed 606 to provide a second sample A[n] for frame n. The frame samples A[n−1] and A[n], are scaled by different interpolation coefficients, then summed 608 and delayed 610 to generate an interpolated sample A*[n] for frames n and n−1. A similar process is performed for samples +B, −B to generate an interpolated sample B*[n]. FIG. 6B shows a similar process to generate interpolated samples C*[n] and D*[n]. It is understood that a1 and a2 in FIG. 6A are interpolation coefficients (scaling factors).

As is readily understood by one of ordinary skill in the art, implementing interpolation with chopping requires logic and circuit area for interpolation coefficients, storage and delay units, as well as at least two frames of samples to generate one set of sample data. In addition, processing disruptions may occur when diagnostic/auxiliary signals are sampled between frames in which case the interpolation coefficient will not be valid resulting in dropped samples or dynamic updated interpolation coefficients, which is costly and complex.

FIG. 7A shows an example chopping scheme for channels A, B, C, D. Looking at channel A, it can be seen there are four samples A1, A2, A3, A4 for 4× chopping. The samples A1, A2, A3, A4 have a virtual sample point VSP about which the samples are equally distributed. If one considers VSP to be at time 0, adding the positive and negative times in relation to time so results in a sum of 0. That is, the samples A1, A2, A3, A4 are symmetric about the VSP. In the illustrated embodiment, sample A1 is the first sample and sample A4 is the last sample with the VSP in the middle. Similarly, sample A2 is the sample directly prior to the VSP and sample A3 is the sample directly after the VSP. In the illustrated embodiment, sample times for A1, A2, A3, A4 are −8, −7, +7, +8, respectively, which sum to zero. The sample times for the other channels similarly sum to zero and are similarly equally distributed in time with respect to the VST at t0.

Samples A1, A2, A3 and A4 may apply to the case of a Hall plate transducer where 4× chopping is desired. For this case, the 4 signals are added to cancel the offset such that $$Vin\_chopped = A1 - A2 + A3 - A4$$

FIG. 7B shows another example chopping scheme for channels A, B, C, D with samples A1, A2, A3, A4 and a virtual sample point VSP about which the samples are equally distributed. The samples Bx, Cx, Dx for the other channels are similarly equally distributed in time with respect to the VSP.

While FIGS. 7A and 7B shows example chopping schemes having a common center of mass for the samples, it is understood that any suitable sample sequence having a center of mass can be used to meet the needs of a particular application without departing from the scope of the invention as claimed. It is further understood that example embodiments can include 2×, 4×, 8×, etc., chopping to meet the needs of a particular application. In addition, while example embodiments of the disclosure are shown and described in conjunction with Hall effect elements, it is understood that embodiments of the disclosure are applicable to any suitable type of magnetic field sensing element in which chopping is performed.

Because of the common center of mass, when averaging the samples with equal weights for demodulation, the equivalent sample obtained from each channel is at this common center of mass. By taking samples symmetrically about the VST, the samples are inherently interpolated by the alignment at the same virtual sampling point from a single frame of data. This configuration eliminates the need for storing interpolation coefficients and logic to perform scaling operation as part of the interpolation process as required by conventional chopping configurations. In example embodiments of the disclosure, each frame of samples provides an output frame of samples with less latency in the data path since there is no longer a need to combine data from different frames.

Figure 8A:
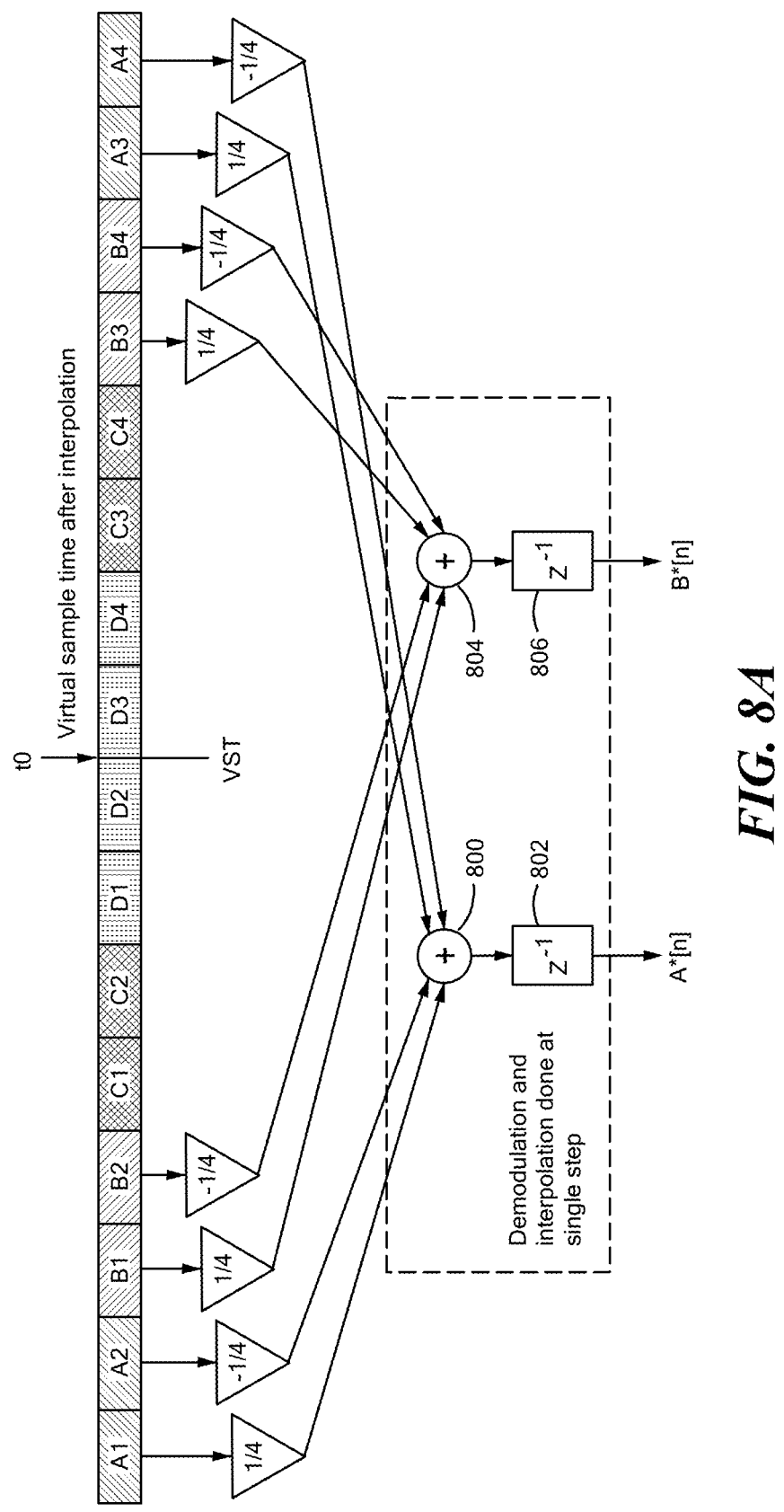
FIG. 8A is a schematic representation of an example 4× chopping scheme for four channels and sample processing for channels A and B.
Figure 8B:
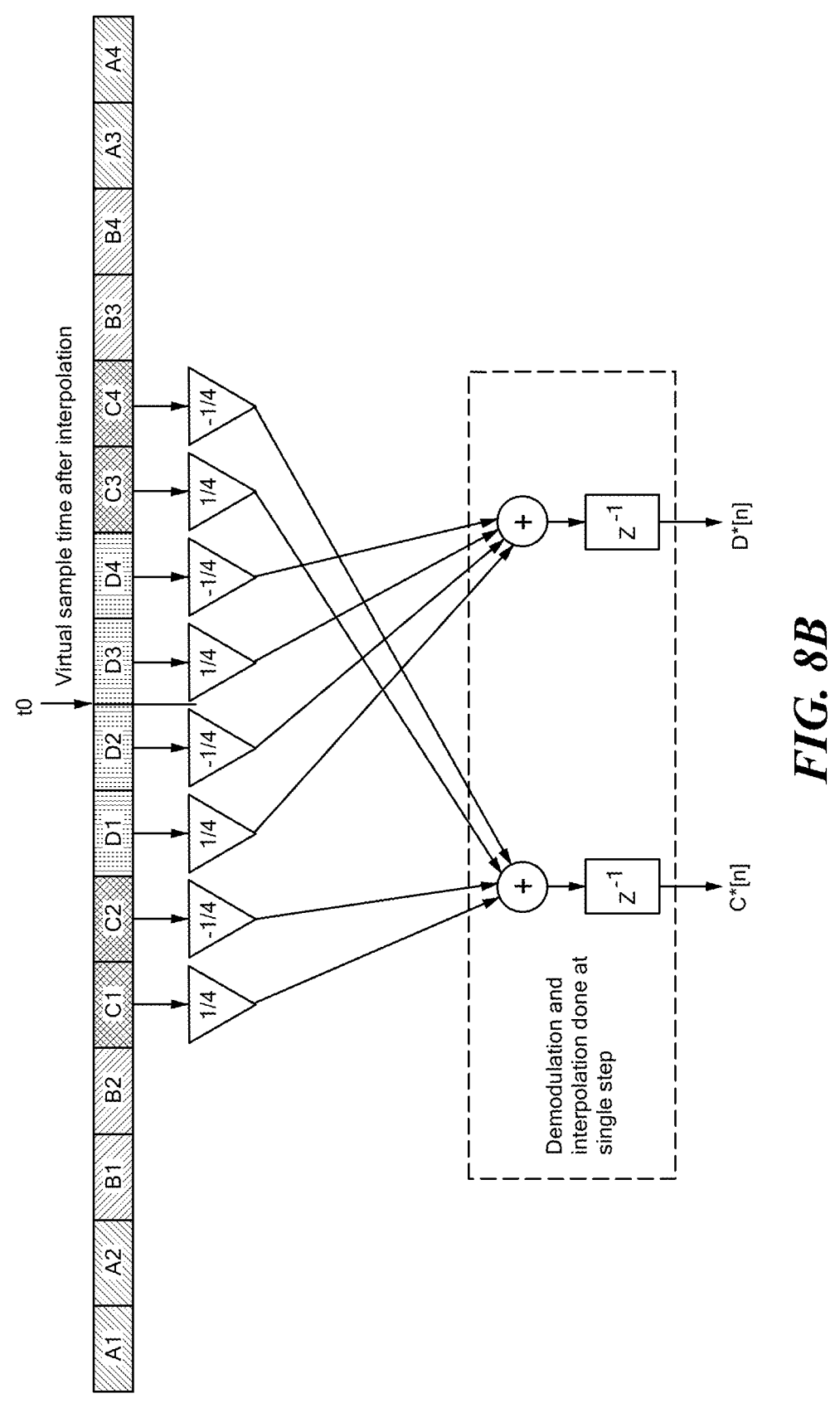
FIG. 8B is a schematic representation of an example 4× chopping scheme and sample processing for channels C and D.

FIG. 8A shows sample processing for channels A and B and FIG. 8B shows processing for channels C and D for the example chopping scheme of FIG. 7B. In the illustrated embodiment, samples for A1 and A2, which are consecutive, are provided to a summer 800. Samples A3 and A4 are also provided to the summer 800. As can be seen, the VST is equidistant between samples A1 and A4 and between samples A2 and A3. The samples A1, A2, A3, A4 are summed and delayed 802 to generate demodulated and interpolated value A*[n]. As can be seen, demodulation and interpolation are performed in a single processing step for a single frame. Samples for B1, B2, B3, B4, which have center of mass in relation to the VSP are summed 804 and delayed 806 in a similar matter to generate B*[n]. FIG. 8B shows example processing for generating C*[n] and D*[n].

Figures 9A, 9B, 9C:
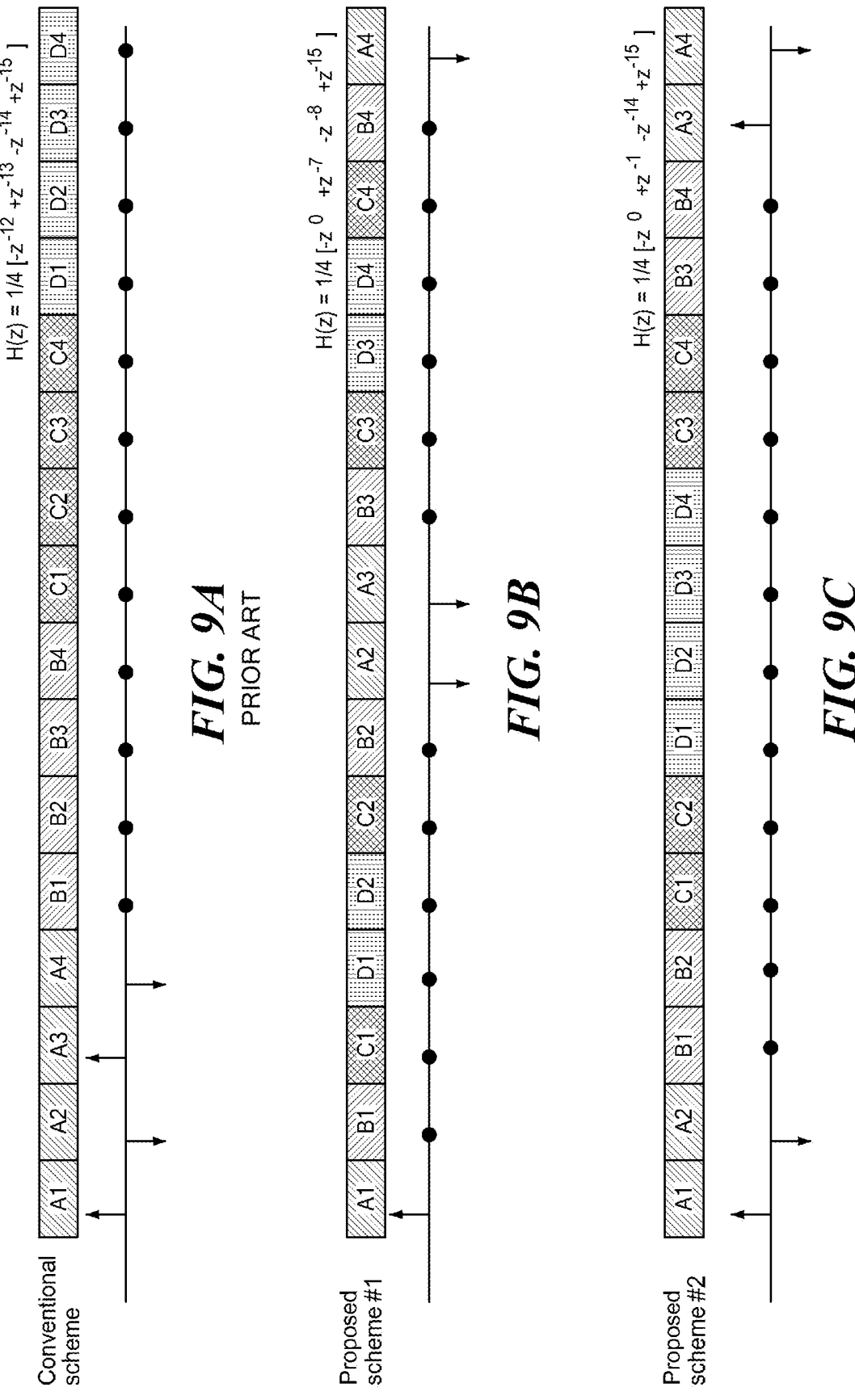
FIG. 9A is a schematic representation of a prior art chopping scheme and its corresponding flicker noise transfer function.
FIG. 9B is a schematic representation of an example chopping scheme to reduce error and its corresponding flicker noise transfer function.
FIG. 9C is a schematic representation of an example chopping scheme to reduce error and its corresponding flicker noise transfer function.

As noted above, chopping is performed at least in part to cancel offset and suppress flicker noise. FIG. 9A shows a prior art chopping scheme with a flicker noise transfer function defined as $$H(z) = \frac{1}{4}\left[-z^{-12} + z^{-13} - z^{-14} + z^{-15}\right]$$

The transfer function shapes the flicker noise for the chopping scheme.

FIG. 9B shows the example chopping scheme of FIG. 7A and flicker noise transfer function defined as:

$$H(z) = \frac{1}{4}\left[-z^{0} + z^{-7} - z^{-8} + z^{-15}\right]$$

FIG. 9C shows the example chopping scheme of FIG. 7B and flicker noise transfer function defined as:

$$H(z) = \frac{1}{4}\left[-z^{0} + z^{-1} - z^{-14} + z^{-15}\right]$$

Figure 10:
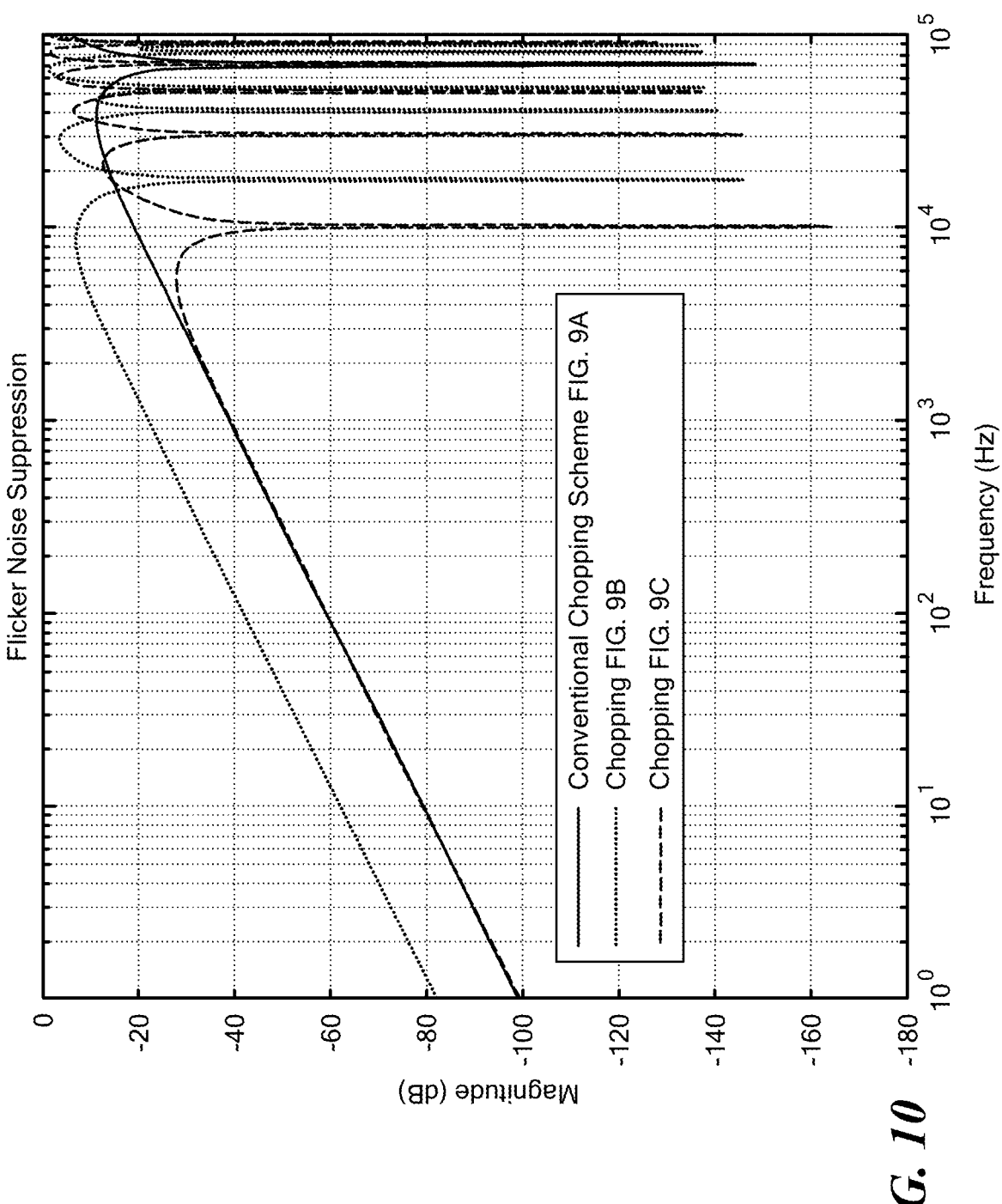
FIG. 10 is a graphical representation of example frequency response to show flicker noise suppression for prior art and the example embodiment chopping schemes of FIGS. 7A and 7B.

FIG. 10 shows a plot of the magnitude response of the transfer functions for the chopping schemes of FIGS. 9A-9C for an assumed sample time of 3.5 us. The frequency responses are shown for each of the transfer functions which represent how much the flicker noise is suppressed by each chopping scheme. It is understood that notches or zeros in flicker noise response are acceptable and may be desirable as increasing suppression for the flicker noise. A factor in comparing the different plots is how much attenuation they offer at low frequencies where flicker noise is relatively high.

As can be seen, the frequency response for FIG. 9C has a noise suppression at low frequencies that is as good as the conventional scheme of FIG. 9A up to about 104 Hz. However, while this frequency response works well with 4× chopping, it does not scale to 2× chopping while maintaining the common-centroid property. For 2× chopping, the response is about the same as the conventional scheme. For 2× chopping, the scheme of FIG. 9B can be used with the additional 20 dBs in flicker noise.

Figure 11:
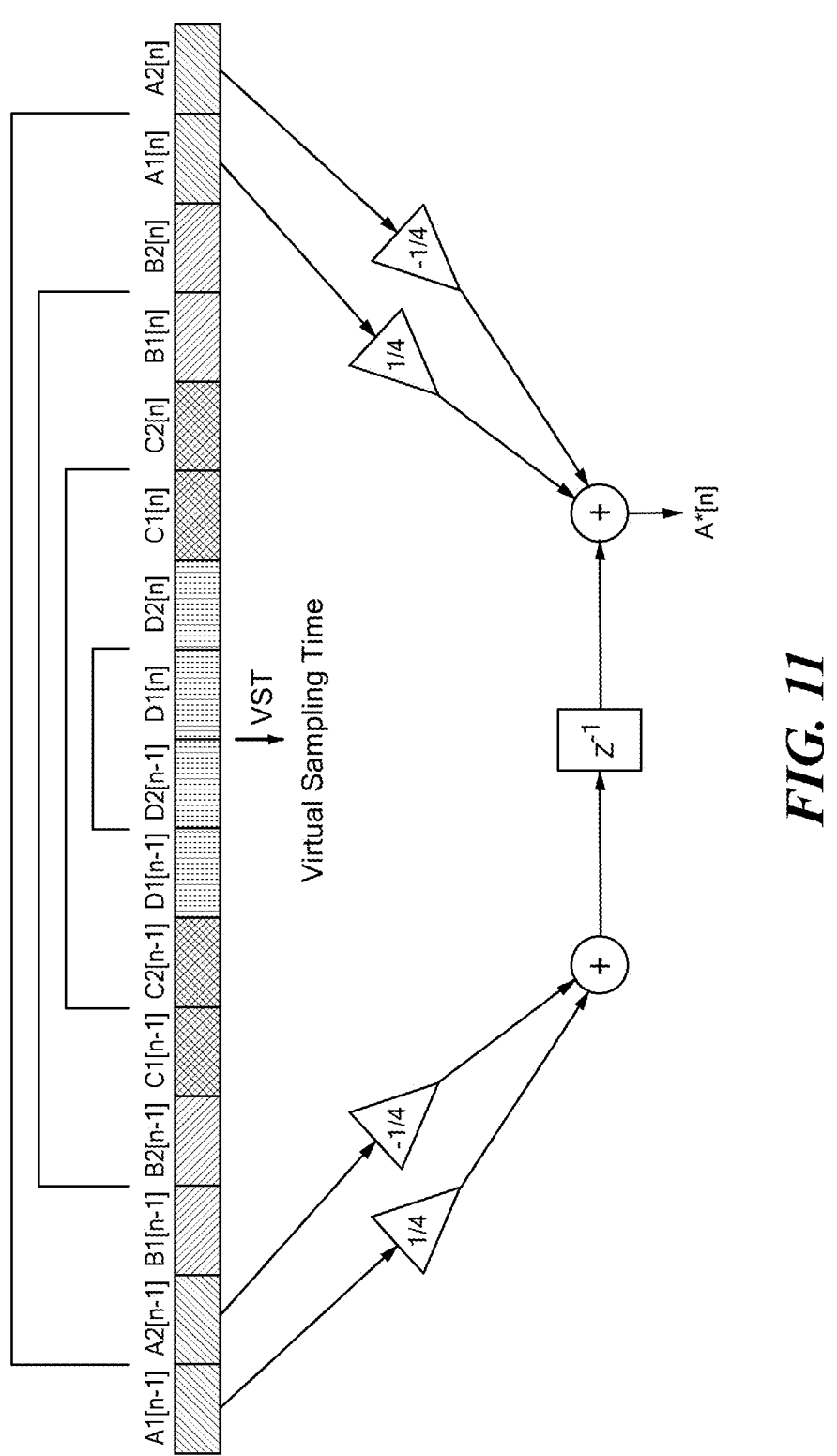
FIG. 11 is a schematic representation of an example mirrored chopping scheme and sample processing that is suitable for optimizing flicker noise performance in case of 2× chopping.

FIG. 11 shows an example chopping scheme suitable for 2× chopping having mirroring to obtain samples as if they passed through a 2-tap moving average FIR. In the illustrated embodiment, channels samples are taken in pairs where sample at time n−1 are to the left of the VST and samples at time n are to the right of the VST. As can be seen, samples A1[n−1] and A2[n−1] are first, followed by B1[n−1] and B2[n−1], and so on. After the VST, samples D1[n] and D2[1], are first, followed by C1[n] and C2[1], B1[n] and B2[1], and A1[n] and A2[1]. As can be seen, the sample pairs, e.g., A 1[n−1], A2[n−1] and A1[n], A2[1], are mirrored about the VST. This slightly added complexity in constructing the frames results in more suppression of flicker noise.

Samples A1[n−1] and A2[n−1] are summed 1100 and delayed 1102 and input to summer 1104. Samples A1[n] and A2[1] are input to the summer 1104 which generates interpolated value A*[n].

Figures 12, 13:
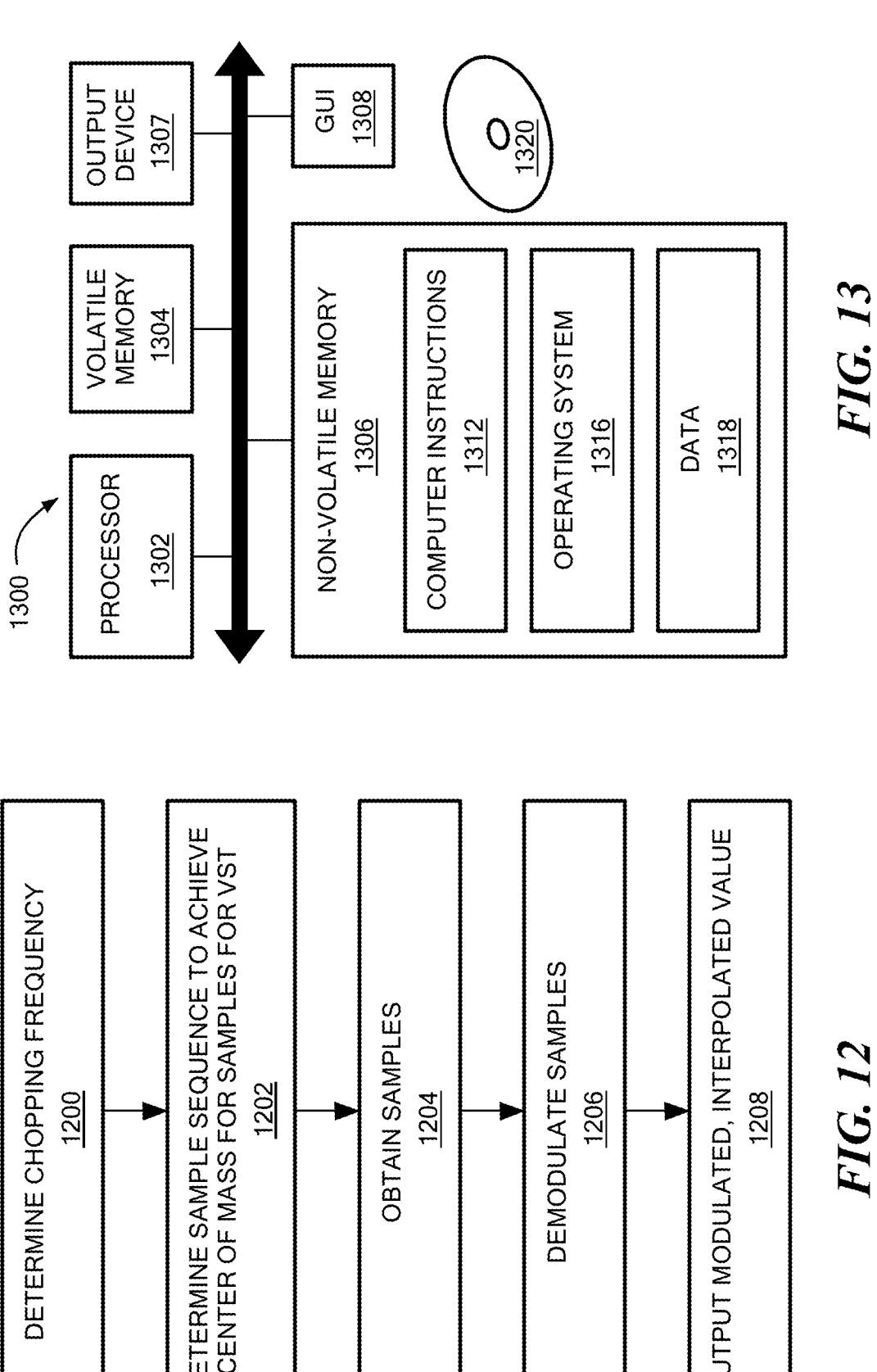
FIG. 12 is a flow diagram showing an example sequence of steps for a chopping scheme to reduce error.
FIG. 13 is a schematic representation of an example computer that can perform at least a portion of the processing described herein.

FIG. 12 shows an example sequence of steps for a chopping scheme to reduce error in a magnetic field sensor having a shared ADC for sensing element channels. In step 1200, a chopping frequency is determined. Chopping can be performed as 2×, 4×, 8× or at any practical rate. In step 1202, a channel sample sequence is determined to achieve a common center of mass for the samples defined by a virtual sample time (VST). In step 1204, channel samples are obtained for one or more frames. In step 1206, the samples are demodulated. It is understood that demodulation inherently achieves interpolation. In step 1208, the demodulated/interpolated value for channel samples is output.

As used herein, the term "magnetic field sensing element" is used to describe a variety of types of electronic elements that can sense a magnetic field. The magnetic field sensing elements can be, but are not limited to, Hall Effect elements, magnetoresistance elements, inductive sensor or magnetotransistors. As is known, there are different types of Hall Effect elements, for example, planar Hall elements, vertical Hall elements, and circular vertical Hall (CVH) elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tends to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor (e.g., a linear magnetic field sensor) that senses a magnetic field density of a magnetic field. Linear magnetic field sensors are used as examples herein. However, the circuits and techniques described herein apply also to any magnetic field sensor capable of detecting a magnetic field.

As used herein, the term "magnetic field signal" is used to describe any circuit signal that results from a magnetic field experienced by a magnetic field sensing element.

FIG. 13 shows an exemplary computer 1300 that can perform at least part of the processing described herein. For example, the computer 1300 can perform processing for chopping channel signals for interpolation and demodulation, as described above. It is understood that processing can be performed in any practical order unless an order is explicitly stated or required to perform the processing. The computer 1300 includes a processor 1302, a volatile memory 1304, a non-volatile memory 1306 (e.g., hard disk), an output device 1307 and a graphical user interface (GUI) 1308 (e.g., a mouse, a keyboard, a display, for example). The non-volatile memory 1306 stores computer instructions 1312, an operating system 1316 and data 1318. In one example, the computer instructions 1312 are executed by the processor 1302 out of volatile memory 1304. In one embodiment, an article 1320 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable embedded processors executing one or more computer programs to perform the functions of the system. All or part of the system may be implemented as special purpose logic circuitry (e.g., an FPGA (field programmable gate array) and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
   receiving a chopping sequence for samples from first and second channels that share an analog-to-digital converter (ADC) in a magnetic field sensor,
   wherein the samples for the first and second channel are arranged in time with respect to a virtual sampling time (VST) at each frame of samples, wherein an average of sample times of samples of a given one of the first and second channels in one frame aligns with the virtual sample time (VST) of the respective time frame.

2. The method according to claim 1, wherein the chopping sequence comprises 2× chopping.

3. The method according to claim 1, wherein the chopping sequence comprises 4× chopping.

4. The method according to claim 1, wherein the samples for the first and second channels are processed in one frame of data.

5. The method according to claim 1, wherein the samples for the first and second channels are demodulated and interpolated in one processing step.

6. The method according to claim 1, wherein the first channel comprises a sine channel and the second channel comprises a cosine channel.

7. The method according to claim 1, further including combining samples for the first channel using a summer for demodulation and a delay function for interpolation.

8. The method according to claim 1, wherein the chopping sequence includes samples for at least four channels.

9. The method according to claim 1, further including determining the chopping sequence to reduce flicker noise.

10. The method according to claim 1, wherein the chopping sequence includes samples for a first frame and samples for a second frame mirrored about the VST to reduce flicker noise.

11. The method according to claim 1, wherein a first magnetic field sensing element is configured to generate the samples for the first channel and a second magnetic field sensing element is configured to generate the samples for the second channel.

12. The method according to 11, wherein the first magnetic field sensing element comprises a Hall element.

13. A magnetic field sensor, comprising:
   an analog-to-digital converter (ADC) configured to receive a chopping sequence for samples from first and second channels that share the ADC;
   wherein the samples for the first and second channel are arranged in time with respect to a virtual sampling time (VST) at each frame of samples, wherein an average of sample times of samples of a given one of the first and second channels in one frame aligns with the virtual sample time (VST) of the respective time frame.

14. The sensor according to claim 13, wherein the chopping sequence comprises 2× chopping.

15. The sensor according to claim 13, wherein the chopping sequence comprises 4× chopping.

16. The sensor according to claim 13, wherein the samples for the first and second channels are processed in one frame of data.

17. The sensor according to claim 13, wherein the samples for the first and second channels are demodulated and interpolated in one processing step.

18. The sensor according to claim 13, wherein the first channel comprises a sine channel and the second channel comprises a cosine channel.

19. The sensor according to claim 13, wherein the sensor is configured to combine samples for the first channel using a summer for demodulation and a delay function for interpolation.

20. The sensor according to claim 13, wherein the chopping sequence includes samples for at least four channels.

21. The sensor according to claim 13, wherein the chopping sequence includes samples for a first frame and samples for a second frame to reduce flicker noise.

22. The sensor according to claim 13, wherein a first magnetic field sensing element is configured to generate the samples for the first channel and a second magnetic field sensing element is configured to generate the samples for the second channel.

23. The method according to 22, wherein the first magnetic field sensing element comprises a Hall element.

* * * * *